(12) United States Patent
Shi

(10) Patent No.: US 9,219,896 B1
(45) Date of Patent: Dec. 22, 2015

(54) METHOD OF COLOR PROCESSING USING A COLOR AND WHITE FILTER ARRAY

(71) Applicant: Himax Imaging Limited, Tainan (TW)

(72) Inventor: MiaoHong Shi, Tainan (TW)

(73) Assignee: HIMAX IMAGING LIMITED, Tainan (TW)

( * ) Notice: Subject to any disclaimer, the term of this patent is extended or adjusted under 35 U.S.C. 154(b) by 0 days.

(21) Appl. No.: 14/303,307

(22) Filed: Jun. 12, 2014

(51) Int. Cl.
  *H04N 9/083* (2006.01)
  *H04N 9/64* (2006.01)
  *H04N 5/335* (2011.01)
  *G02B 5/20* (2006.01)
  *H01L 27/146* (2006.01)
  *H04N 5/228* (2006.01)

(52) U.S. Cl.
  CPC .. *H04N 9/64* (2013.01); *G02B 5/20* (2013.01); *H01L 27/14621* (2013.01); *H01L 27/14643* (2013.01); *H01L 27/14667* (2013.01); *H04N 5/335* (2013.01); *H04N 2209/045* (2013.01); *H04N 2209/046* (2013.01)

(58) Field of Classification Search
  USPC .................. 348/273, 275, 276, 277
  See application file for complete search history.

(56) References Cited

U.S. PATENT DOCUMENTS

| 8,508,633 | B2 * | 8/2013 | Hirose | ........................ 348/277 |
| 8,948,506 | B2 * | 2/2015 | Saito et al. | ............. H04N 9/045 382/162 |
| 2010/0315541 | A1 * | 12/2010 | Egawa | ........................ 348/294 |

* cited by examiner

*Primary Examiner* — Ngoc-Yen Vu
(74) *Attorney, Agent, or Firm* — Tim Tingkang Xia, Esq.; Locke Lord LLP

(57) ABSTRACT

A method of color processing includes providing a color and white filter array placed over an image sensor, thereby generating converted color and white signals; interpolating the converted white signals to generate interpolated white signals; interpolating white-chroma differences between the converted color signals and the converted white signals to generate interpolated white-chroma difference signals; and transforming the interpolated white signal and the interpolated white-chroma difference signals into a color space, thereby generating transformed color signals.

20 Claims, 6 Drawing Sheets

METHOD OF COLOR PROCESSING USING A COLOR AND WHITE FILTER ARRAY

BACKGROUND OF THE INVENTION

1. Field of the Invention

The present invention generally relates to a color and white filter array, and more particularly to a method of color processing using an RGBW filter array.

2. Description of Related Art

A Bayer filter, as depicted in FIG. 1, is a color filter array composed of red (R), green (G) and blue (B) color filters disposed on a grid of photo-sensors, and specifically configured with a pattern of 50% green, 25% red and 25% blue. The Bayer filter with the photo-sensors forms an image sensor that is commonly used in electronic devices such as digital cameras or camcorders.

As each composing color filter of the Bayer filter passes only one color, information of other colors at each pixel position need be calculated by interpolation. The image sensor with the Bayer filter generally suffers from low sensitivity and low signal noise ratio (SNR). A modified Bayer filter with transparent white (W) filter (commonly called RGBW filter array) is thus introduced to improve sensitivity and SNR. The conventional image sensor with RGBW filter array, however, does not make effective use of the color and white information, and therefore cannot effectively improve sensitivity and SNR while preserving resolution and minimizing color artifacts.

A need has thus arisen to propose a novel scheme of processing the color and white information obtained from the RGBW filter array in order to overcome the disadvantages mentioned above.

SUMMARY OF THE INVENTION

In view of the foregoing, it is an object of the embodiment of the present invention to provide a method of color processing using a color and white filter array that performs pixel adaptive edge-sensing interpolation of white signal, and effectively utilizes white and white-chroma difference for color space transformation, therefore substantially improving sensitivity and signal noise ratio while preserving resolution and minimizing color artifacts. Moreover, the embodiment may provide flexible sharpness control and/or low light auto-exposure adjustment.

According to one embodiment, a color and white filter array is placed over pixels sensors of an image sensor, thereby generating converted color signals and converted white signals. The converted white signals are interpolated to generate interpolated white signals. White-chroma differences between the converted color signals and the converted white signals are interpolated to generate interpolated white-chroma difference signals. The interpolated white signal and the interpolated white-chroma difference signals are transformed into a color space, thereby generating transformed color signals.

DETAILED DESCRIPTION OF THE INVENTION

Figure 2:
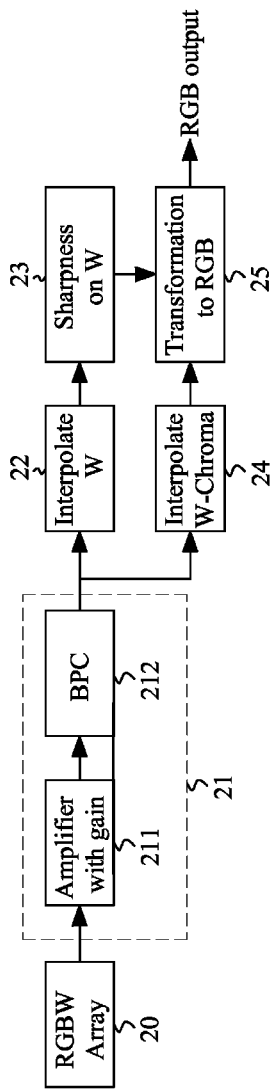
FIG. 2 shows a block diagram illustrated of color processing according to one embodiment of the present invention.

FIG. 2 shows a block diagram illustrated of color processing according to one embodiment of the present invention. In the embodiment, the color processing may be performed by a processor such as a digital image processor.

According to the embodiment, a color and white filter array (filter array hereinafter) 20 is used to filter light. Specifically, the filter array 20 is composed of color filters, such as red (R) filters, green (G) filters and/or blue (B) filters, which filter light by wavelength range. The filter array 20 further includes white (W) filters that pass, or is transparent to, light in visible wavelength. In the embodiment, a filter array 20 composed of red filter, green filters, blue filters and white filters is adopted, and the filter array 20 of the embodiment may sometimes be referred to as an RGBW array instead.

Figure 1:
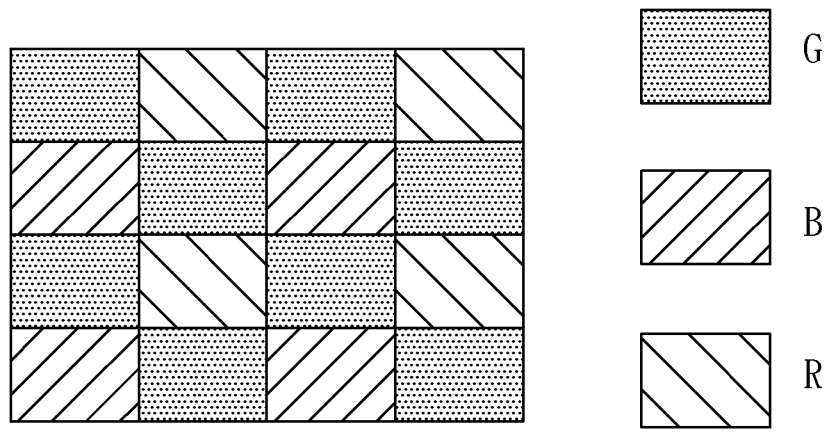
FIG. 1 schematically shows a Bayer filter.
Figure 3:
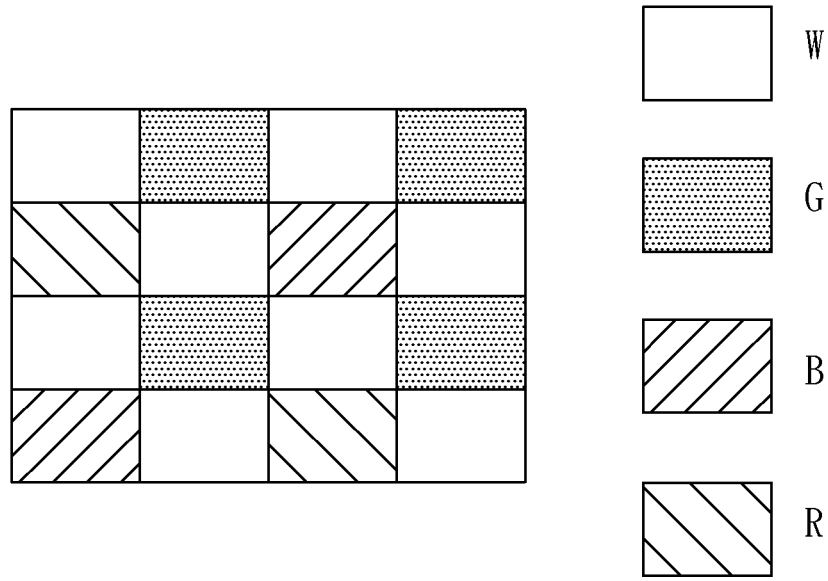
FIG. 3 shows an exemplary array pattern of a portion of the RGBW array of FIG. 2.

FIG. 3 shows an exemplary array pattern (4×4 array is shown here) of a portion of the RGBW array 20 of FIG. 2. The array pattern of the RGBW array 20 is configured of 50% white, 25% green, 12.5% red and 12.5% blue in a manner similar to a Bayer pattern as exemplified in FIG. 1.

The RGBW array 20 of the embodiment is generally placed over pixels sensors (or photo-sensors) of an image sensor, such as complementary metal-oxide-semiconductor (CMOS) image sensor, which converts an optical image captured by the RGBW array 20 into electrical signals. Specifically, the image sensor along with an associated circuitry 21 converts red light captured by the red filter into a red signal, converts green light captured by the green filter into a green signal, converts blue light captured by the blue filter into a blue signal, and converts white light captured by the white filter into a white signal.

The circuitry 21 associated with the image sensor may include, for example, an amplifier 211 with gains and a bad-pixel corrector (BPC) 212. The amplifier 211 and the BPC 212 may be implemented by conventional technique, details of which are omitted for brevity.

Figure 4:
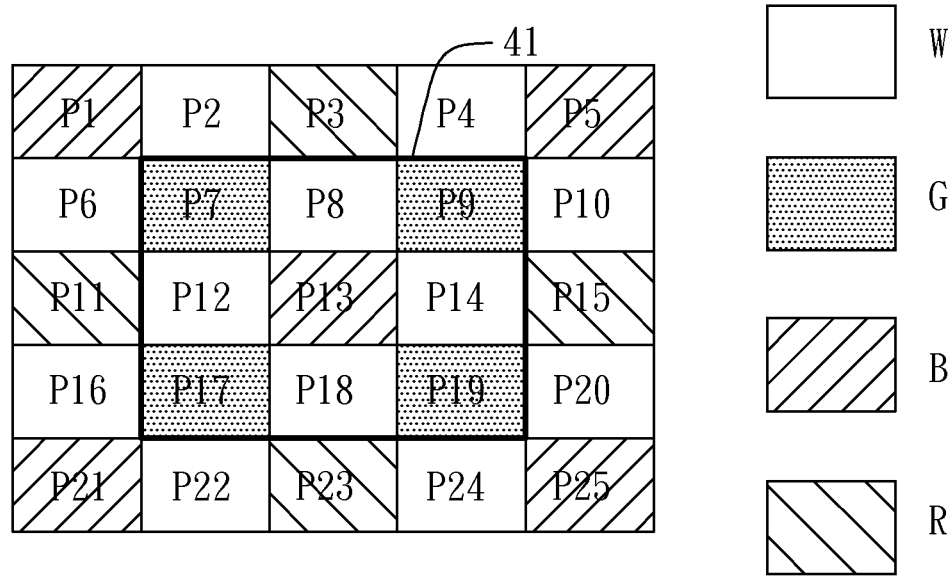
FIG. 4 exemplarily shows a portion of the RGBW array of FIG. 2 with a working window centered at a current center pixel.

In the embodiment, as shown in FIG. 2, the converted white signals are then subjected to an interpolation 22, particularly an adaptive edge-sensing interpolation. FIG. 4 exemplarily shows a portion of the RGBW array 20 (5×5 array is shown) with a (e.g., 3×3) working window 41 centered at a current center pixel (P13 in this example).

Figure 5:
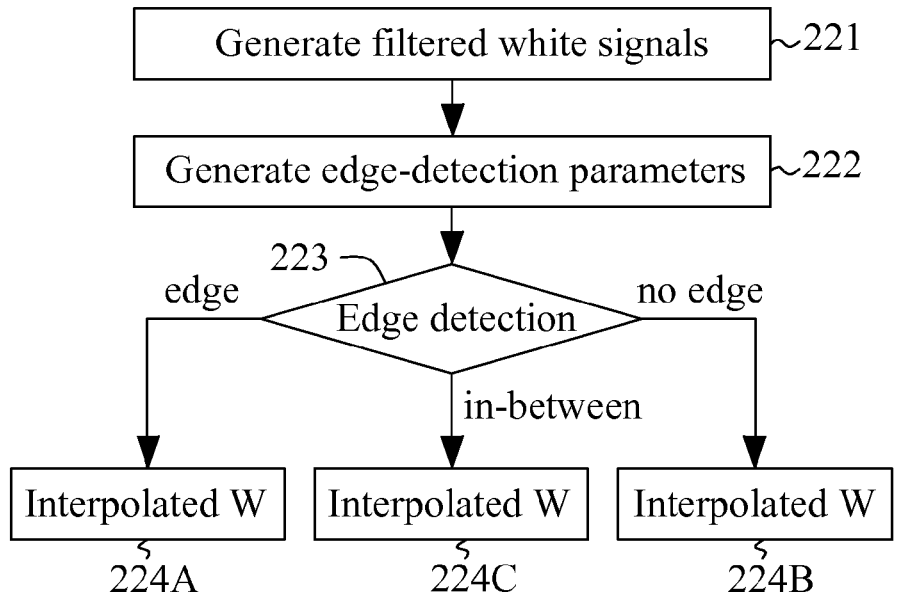
FIG. 5 illustrates a flow diagram of the white interpolation block of FIG. 2 according to one embodiment of the present invention.

FIG. 5 illustrates a flow diagram of the white interpolation block 22 of FIG. 2 according to one embodiment of the present invention. In step 221, a filtered white (FW) signal for each pixel in the working window 41 may be generated by filtering, such as low-pass filtering, neighboring converted white signals according to the following exemplary expressions:

FW7=(W2+W6+W8+W12)/4;
FW8=0.5*W8+(W2+W4+W12+W14)/8;
FW9=(W4+W8+W10+W14)/4;
FW12=0.5*W12+(W6+W8+W16+W18)/8;
FW13=(W8+W12+W14+W18)/4;
FW14=0.5*W14+(W8+W10+W18+W20)/8;
FW17=(W12+W16+W18+W22)/4;
FW18=0.5*W18+(W12+W14+W22+W24)/8;
FW19=(W14+W18+W20+W24)/4

For example, a filtered white signal FW7 at the pixel P7 may be generated by averaging neighboring converted white signals, that is, W2, W6, W8 and W12. Similarly, for example, a filtered white signal FW8 at the pixel P8 may be generated by taking weighted average of neighboring converted white signals (i.e., W2, W4, W12 and W14) with a weight of ⅛ and the converted white signal at the pixel P8 itself with a (greater) weight of 0.5.

Subsequently, in step 222, edge-detection parameters are generated using the filtered white signals in the working window 41 according to the following exemplary expressions:

V_l=abs(FW12-FW7)+abs(FW12-FW17);
V_c=abs(FW13-FW8)+abs(FW13-FW18);
V_r=abs(FW14-FW9)+abs(FW14-FW19);
V_con=V_l<FW12*Eth&&V_c<FW13*Eth&&V_r<FW14*Eth;
H_t=abs(FW8-FW7)+abs(FW8-FW9);
H_c=abs(FW13-FW12)+abs(FW13-FW14);
H_b=abs(FW18-FW17)+abs(FW18-FW19);
H_con=H_t<FW8*Eth&&H_c<FW13*Eth&&H_b<FW18*Eth;
EV=V_l+V_c+V_r+H_t+H_c+H_b For example, a sum V_l of absolute values of pairs of adjacent pixels (e.g., a pair of P12 and P7, and a pair of P12 and P17) along a vertically left direction may be generated to indicate the extent of detecting an edge along that direction (e.g., the less the value is, the more probably an edge exists). Similarly, for example, a sum H_t of absolute values of pairs of adjacent pixels (e.g., a pair of P8 and P7, and a pair of P8 and P9) along a horizontally top direction may be generated to indicate the extent of detecting an edge along that direction.

Afterwards, in step 223, edge detection is performed based on the edge-detection parameters generated from step 222. In the embodiment, one of three edge-detection decisions is determined: an edge detected, no edge detected, and an in-between. Finally, in step 224A, 224B or 224C (depending on the determined edge-detection decision), an interpolated white signal (e.g., W13) at the current center pixel (e.g., P13 in the example) may be generated according to the converted white signals in the working window 41 in accordant with the determined edge-detection decision. Steps 223 and 224A-C may be carried out according to the following exemplary expressions, where ev_thL and ev_thH are threshold values:

(1) Edge Detected:
If EV>FW13*ev_thH $$W13 = \begin{cases} (W8+W18)/2 & \text{if } V\_con \,\&\&\, H\_con \,\&\&\, V\_l + V\_c + V\_r < H\_t + H\_c + H\_b \\ (W12+W14)/2 & \text{if } V\_con \,\&\&\, H\_con \,\&\&\, V\_l + V\_c + V\_r > H\_t + H\_c + H\_b \\ (W8+W18)/2 & \text{if } V\_con \,\&\&\, \sim H\_con \\ (W12+W14)/2 & \text{if } H\_con \,\&\&\, \sim V\_con \\ (W8+W18+W12+W14)/4 & \text{else} \end{cases}$$

(2) No Edge Detected
If EV<FW13*ev_thL $$W13 = d_L = (W8+W18+W12+W14)/4$$

(3) In-Between
If FW13*ev_thL≤EV≤FW13*ev_thH $$W13 = (1-\alpha)*d_L + \alpha*d_H$$

where $$\alpha = \frac{EV - FW13*ev\_thL}{(ev\_thH - ev\_thL)*FW13}$$

Summarily speaking, in case a vertical edge has been detected, the interpolated white signal is generated by averaging neighboring converted white signals (e.g., W8 and W18) along the edge. In case a horizontal edge has been detected, the interpolated white signal is generated by averaging neighboring converted white signals (e.g., W12 and W14) along the edge. In case no edge has been detected, the interpolated white signal is generated by averaging all neighboring converted white signals (e.g., W8, W18, W12 and W14). In case an in-between has been detected, the interpolated white signal is a weighted sum of the interpolated white signal with an edge detected, and the interpolated white signal without an edge detected.

Referring back to FIG. 2, sharpness enhancement 23 may be further performed on the interpolated white signal. Specifically, scaled differences between the interpolated signal of the current white center pixel (e.g., P13 in FIG. 4) and the converted white signals of neighboring pixels (e.g., P8, P12, P14 and P18) may be added back to the current white center pixel to generate a weighted average value with enhanced sharpness. Other conventional technique may be adopted to perform sharpness enhancement 23 on the interpolated white signal.

Figure 7:
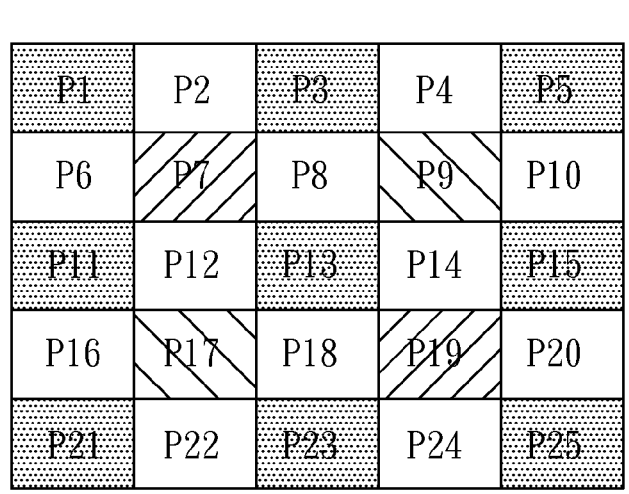
FIG. 7 exemplarily shows a portion of the RGBW array of FIG. 2 with a current green center pixel.
Figure 7:
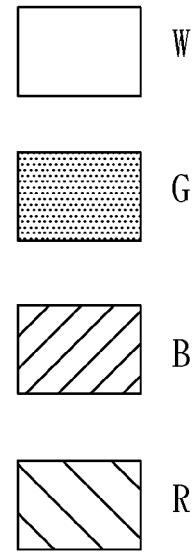
Figure 8:
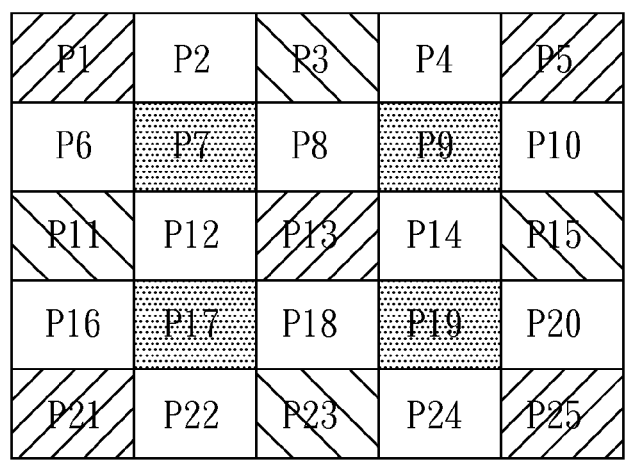
FIG. 8 exemplarily shows a portion of the RGBW array of FIG. 2 with a current blue center pixel.
Figure 8:
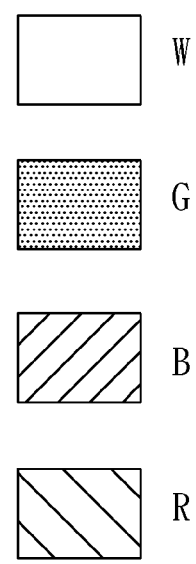

Still referring to FIG. 2, the converted color signals (e.g., red, green and/or blue signals) and white signals are subjected to an interpolation 24 of white-chroma (or white-color) difference (e.g., W-R, W-G, W-B). The white-chroma interpolation 24 may be performed in one of four manners depending on what the current center pixel is: a white pixel (as exemplified in FIG. 6), a green pixel (as exemplified in FIG. 7), a blue pixel (as exemplified in FIG. 8) and a red pixel.

Figure 6:
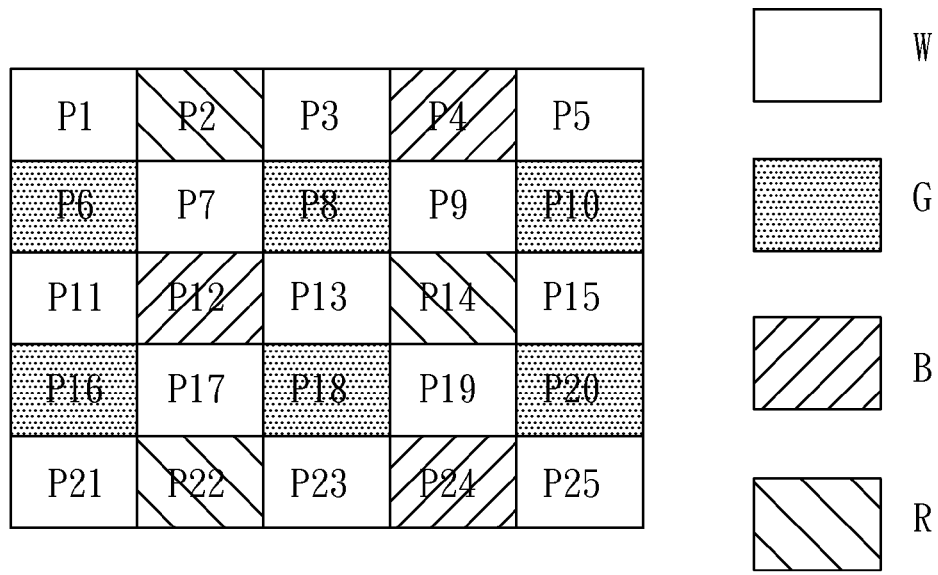
FIG. 6 exemplarily shows a portion of the RGBW array of FIG. 2 with a current white center pixel.
Figure 9:
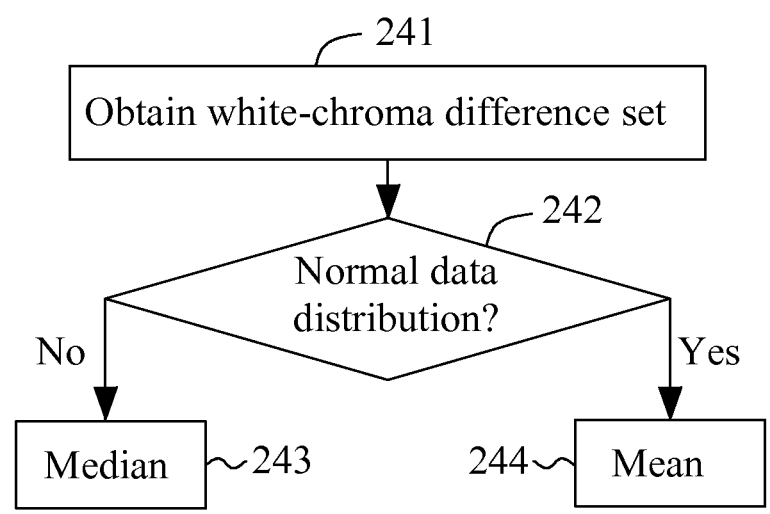
FIG. 9 illustrates a flow diagram of the white-chroma interpolation block of FIG. 2 according to one embodiment of the present invention.

Take the current white center pixel demonstrated in FIG. 6 as an example, FIG. 9 illustrates a flow diagram of the white-chroma interpolation block 24 of FIG. 2 according to one embodiment of the present invention. In step 241, a white-red difference set dWR_set10 composed of differences respectively between the converted white signals and neighboring converted red signals is obtained, a white-green difference set dWG_set16 composed of differences respectively between the converted white signals and neighboring converted green signals is obtained, and a white-blue difference set dWB_set10 composed of differences respectively between the converted white signals and neighboring converted blue signals is obtained. Obtaining the white-chroma difference sets in step 241 may be carried out according to the following exemplary expressions:

at P13:
dWR_set10=[W13-R14;W9-R14;W15-R14;W19-R14; W7-R2;W1-R2;W3-R2;W17-R22;W21-R22;W23-R22];
dWG_set16=[W3-G8;W7-G8;W13-G8;W9-G8;W13-G18;W17-G18;W19-G18;W23-G18; W7-G6;W11-G6;W11-G16;W17-G16;W19-G20;W15-G20;W15-G10;W9-G10];

dWB_set10=[W7-B12;W11-B12;W17-B12;W13-B12;
W3-B4;W5-B4;W9-B4;W19-B24;W23-B24;W25-B24]

Subsequently, in step 242, the white-chroma difference set is analyzed to determine its data distribution. In the embodiment, a ratio of (maximum value minus minimum value) to (maximum value plus minimum value) of the white-chroma difference set is used to determine data distribution. If the ratio is greater than a threshold value th, indicating that the white-chroma difference set is not normally distributed, a median of the white-chroma difference set is preferably used as an interpolated white-chroma difference signal (step 243), otherwise, a mean of the white-chroma difference set is used as an interpolated white-chroma difference signal (step 244). Steps 242-244 may be carried out according to the following exemplary expressions:

dWR=median(dWR_set10); if (max(dWR_set10)−
  min(dWR_set10))/(max(dWR_set10)+
  min(dWR_set10))>th;
Else dWR=mean(dWR_set10);
dWG=median(dWG_set16); if
  (max(dWG_set16)−min(dWG_set16))/
  (max(dWG_set16)+min(dWG_set16))>th;
Else dWG=mean(dWG_set16);
dWB=median(dWB_set10); if
  (max(dWB_set10)−min(dWB_set10))/
  (max(dWB_set10)+min(dWB_set10))>th;
Else dWB=mean(dWB_set10)

The interpolation 24 of white-chroma difference with a green current center pixel (FIG. 7) may be carried out according to the following exemplary expressions. It is noted that W, G, R or B in the following expressions may represent the filtered signal if it is not available directly from the RGBW array 20.

at P13:
dWR_set8=[W13-R14;W9-R14;W15-R14;W19-R14;
  W7-R2;W1-R2;W3-R2;W17-R22; W21-R22;
  W23-R22];
dWG_set16=[W3-G8;W7-G8;W13-G8;W9-G8;W13-
  G18;W17-G18;W19-G18;W23-G18;   W7-G6;W11-
  G6;W11-G16;W17-G16;W19-G20;W15-G20;W15-
  G10;W9-G10];
dWB_set8=[W7-B12;W11-B12;W17-B12;W13-B12;
  W3-B4;W5-B4;W9-B4;W19-B24; W23-B24; W25-
  B24];
dWR=median(dWR_set8); if
  (max(dWR_set8)−min(dWR_set8))/(max(dWR_set8)+
  min(dWR_set8))>th;
Else dWR=mean(dWR_set8);
dWG=median(dWG_set16); if
  (max(dWG_set16)−min(dWG_set16))/
  (max(dWG_set16)+min(dWG_set16))>th;
Else dWG=mean(dWG_set16);
dWB=median(dWB_set8); if
  (max(dWB_set8)−min(dWB_set8))/(max(dWB_set8)+
  min(dWB_set8))>th;
Else dWB=mean(dWB_set8)

The interpolation 24 of white-chroma difference with a blue current center pixel (FIG. 8) may be carried out according to the following exemplary expressions. It is noted that W, G, R or B in the following expressions may represent the filtered signal if it is not available directly from the RGBW array 20.

at P13:
dWR_set12=[W2-R3;W4-R3;W8-R3;W6-R11;W16-
  R11;W12-R11;W18-R23;W22-R23;W24-R23;W10-
  R15;W14-R15;W20-R15];
dWG_set16=[W2-G7;W6-G7;W8-G7;W12-G7;W4-G9;
  W8-G9;W10-G9;W14-G9; W12-G17;W16-G17;W18-
  G17;W22-G17;W18-G19;W14-G19;W20-G19;W24-
  G19],
dWB_set12=[W8-B13;W12-B13;W14-B13;W18-B13;
  W2-B1;W6-B1;W4-B5;W10-B5;W16-B21;
  W22-B21;W20-B25;W24-B25];
dWR=median(dWR_set12); if
  (max(dWR_set12)−min(dWR_set12))/
  (max(dWR_set12)+min(dWR_set12))>th;
Else dWR=mean(dWR_set12);
dWG=median(dWG_set16); if
  (max(dWG_set16)−min(dWG_set16))/
  (max(dWG_set16)+min(dWG_set16))>th;
Else dWG=mean(dWG_set16);
dWB=median(dWB_set12); if
  (max(dWB_set12)−min(dWB_set12))/
  (max(dWB_set12)+min(dWB_set12))>th;
Else dWB=mean(dWB_set12)

The interpolation 24 of white-chroma difference with a red current center pixel may be carried out in a manner similar to the interpolation with a blue current center pixel, and details of which are thus omitted for brevity.

Referring back to FIG. 2, the interpolated white signal from the block 22 (or enhanced one from the block 23) and the interpolated white-chroma difference signals from the block 24 are transformed into a color space (e.g., RGB space), therefore generating transformed color signals. Specifically, in the embodiment, a transformed red signal may be generated by subtracting the interpolated white-red difference signal from the interpolated white signal, a transformed green signal may be generated by subtracting the interpolated white-green difference signal from the interpolated white signal, and a transformed blue signal may be generated by subtracting the interpolated white-blue difference signal from the interpolated white signal, according to the following exemplary expressions. It is noted that W in the following expressions represent the interpolated white signal.

$$\hat{R} = W - dWR;$$

$$\hat{G} = W - dWG;$$

$$\hat{B} = W - dWB;$$

In an alternative embodiment, the transformed color signals may be generated taking into consideration low light (i.e., less than normal lighting) auto-exposure adjustment. Specifically, auto-exposure may generally be determined by integration time (INTG), analog gain (AG) and digital gain (DG) obtained from the circuitry 21. A parameter α, which acts as weighting on the interpolated white signal, is introduced here for brightness adaptation under different lighting conditions. The transformed color signals, in the embodiment, may be generated according to the following exemplary expressions:

$$\hat{R} = W - (1-\alpha)*dWR = \alpha*W - (1-\alpha)*R;$$

$$\hat{G} = W - (1-\alpha)*dWR = \alpha*W - (1-\alpha)*G;$$

$$\hat{B} = W - (1-\alpha)*dWR = \alpha*W - (1-\alpha)*B;$$

In normal lighting, the parameter α is equal to 0. As lighting goes down, INTG, AG and DG mentioned above all moves toward maximum. The parameter α starts to increase from 0 to 1 so that the brightness is boosted. Suppose an auto-exposure target is $AE_{target}$, a current mean brightness value is $Y_{mean}$, a current mean white value is $W_{mean}$, then the parameter α may be obtained as:

$$\alpha = \min\left(\frac{AE_{target}/Y_{mean} - 1}{W_{mean}/Y_{mean} - 1}, 1\right)$$

i.e. $\alpha = \frac{AE_{target}/Y_{mean} - 1}{W_{mean}/Y_{mean} - 1}$ if $\frac{AE_{target}/Y_{mean} - 1}{W_{mean}/Y_{mean} - 1} <= 1$ otherwise $\alpha=1$
the corresponding low light brightness gain=

$$\alpha * \frac{W_{mean}}{Y_{mean}} + (1 - \alpha)$$

Although specific embodiments have been illustrated and described, it will be appreciated by those skilled in the art that various modifications may be made without departing from the scope of the present invention, which is intended to be limited solely by the appended claims.

What is claimed is:

1. A method of color processing using a color and white filter array, comprising a processor performing the following steps:
providing the color and white filter array placed over pixels sensors of an image sensor, thereby generating converted color signals and converted white signals;
interpolating the converted white signals, thereby generating interpolated white signals, comprising:
generating a filtered white signal for each pixel in a working window;
generating edge-detection parameters according to the filtered white signals in the working window;
performing edge detection based on the edge-detection parameters; and
generating an interpolated white signal at a current center pixel according to the converted white signals in the working window in accordant with a decision of the edge-detection;
interpolating white-chroma differences between the converted color signals and the converted white signals, thereby generating interpolated white-chroma difference signals; and
transforming the interpolated white signal and the interpolated white-chroma difference signals into a color space, thereby generating transformed color signals.

2. The method of claim 1, wherein the color and white filter array comprises red (R) filters, green (G) filters, blue (B) filters and white (W) filters, thereby resulting in an RGBW array.

3. The method of claim 1, wherein the filtered white signal is generated by low-pass filtering neighboring converted white signals.

4. The method of claim 1, further comprising a step of sharpness enhancement performed on the interpolated white signal.

5. The method of claim 4, wherein the step of sharpness enhancement comprises:
adding scaled differences between the interpolated signal of a current white center pixel and the converted white signals of neighboring pixels to the current white center pixel.

6. The method of claim 1, wherein the step of interpolating white-chroma differences is performed differently depending on what a current center pixel is.

7. The method of claim 1, wherein the step of interpolating white-chroma differences comprises:
generating a plurality of white-chroma difference sets each composed of differences respectively between the converted white signals and neighboring converted color signals; and
analyzing the white-chroma difference sets to determine data distribution therein, according to which the interpolated white-chroma difference signals are generated.

8. The method of claim 7, wherein a median of the white-chroma difference sets is used as the interpolated white-chroma difference signal when data therein is not normally distributed.

9. The method of claim 8, wherein a mean of the white-chroma difference sets is used as the interpolated white-chroma difference signal when the data therein is normally distributed.

10. The method of claim 9, wherein the data is not normally distributed when a ratio of (maximum value minus minimum value) to (maximum value plus minimum value) of the white-chroma difference set is greater than a threshold value, otherwise the data is normally distributed.

11. The method of claim 1, wherein the step of generating the transformed color signals comprises:
subtracting the interpolated white-chroma difference signal from the interpolated white signal.

12. The method of claim 1, wherein the transformed color signal is a weighted sum of the interpolated white signal and the interpolated white-chroma difference signal.

13. The method of claim 12, wherein a weighting of the weighted sum is determined according to integration time (INTG), analog gain (AG) and digital gain (DG).

14. A method of color processing using a color and white filter array, comprising a processor performing the following steps:
providing the color and white filter array placed over pixels sensors of an image sensor, thereby generating converted color signals and converted white signals;
interpolating the converted white signals, thereby generating interpolated white signals;
performing sharpness enhancement on the interpolated white signal by adding scaled differences between the interpolated signal of a current white center pixel and the converted white signals of neighboring pixels to the current white center pixel;
interpolating white-chroma differences between the converted color signals and the converted white signals, thereby generating interpolated white-chroma difference signals; and
transforming the interpolated white signal and the interpolated white-chroma difference signals into a color space, thereby generating transformed color signals.

15. A method of color processing using a color and white filter array, comprising a processor performing the following steps:
providing the color and white filter array placed over pixels sensors of an image sensor, thereby generating converted color signals and converted white signals;
interpolating the converted white signals, thereby generating interpolated white signals;
interpolating white-chroma differences between the converted color signals and the converted white signals, thereby generating interpolated white-chroma difference signals, comprising:
generating a plurality of white-chroma difference sets each composed of differences respectively between the converted white signals and neighboring converted color signals; and analyzing the white-chroma difference sets to determine data distribution therein, according to which the interpolated white-chroma difference signals are generated; and transforming the interpolated white signal and the interpolated white-chroma difference signals into a color space, thereby generating transformed color signals.

16. The method of claim 15, wherein a median of the white-chroma difference sets is used as the interpolated white-chroma difference signal when data therein is not normally distributed.

17. The method of claim 16, wherein a mean of the white-chroma difference sets is used as the interpolated white-chroma difference signal when the data therein is normally distributed.

18. The method of claim 17, wherein the data is not normally distributed when a ratio of (maximum value minus minimum value) to (maximum value plus minimum value) of the white-chroma difference set is greater than a threshold value, otherwise the data is normally distributed.

19. The method of claim 15, wherein the step of generating the transformed color signals comprises:

subtracting the interpolated white-chroma difference signal from the interpolated white signal.

20. The method of claim 15, wherein the transformed color signal is a weighted sum of the interpolated white signal and the interpolated white-chroma difference signal, and a weighting of the weighted sum is determined according to integration time (INTG), analog gain (AG) and digital gain (DG).

* * * * *